(12) United States Patent
Jung et al.

(10) Patent No.: US 7,968,973 B2
(45) Date of Patent: Jun. 28, 2011

(54) SEMICONDUCTOR FOR MACRO AND MICRO FREQUENCY TUNING, AND ANTENNA AND FREQUENCY TUNING CIRCUIT HAVING THE SEMICONDUCTOR

(75) Inventors: Chang-won Jung, Hwaseong-si (KR); Jung-han Choi, Hwaseong-si (KR); In-sang Song, Seoul (KR); Young-eil Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 474 days.

(21) Appl. No.: 11/727,697

(22) Filed: Mar. 28, 2007

(65) Prior Publication Data

US 2008/0099881 A1 May 1, 2008

(30) Foreign Application Priority Data

Oct. 26, 2006 (KR) ........................ 10-2006-0104381

(51) Int. Cl.
*H01L 29/93* (2006.01)
(52) U.S. Cl. ........ 257/601; 257/656; 438/379; 438/381; 332/136
(58) Field of Classification Search .................. None
See application file for complete search history.

(56) References Cited

U.S. PATENT DOCUMENTS

| 5,581,115 | A |   | 12/1996 | Grubisich et al. |         |
|-----------|---|---|---------|------------------|---------|
| 5,668,057 | A | * | 9/1997  | Eda et al. ....... | 438/113 |
| 5,757,074 | A | * | 5/1998  | Matloubian et al. ......... | 257/702 |
| 6,002,860 | A |   | 12/1999 | Voinigescu et al. |         |
| 6,429,500 | B1 | * | 8/2002 | Greenberg et al. .......... | 257/458 |
| 6,531,936 | B1 |   | 3/2003 | Chiu et al.       |         |
| 6,777,771 | B1 |   | 8/2004 | Marumoto et al.   |         |
| 7,005,725 | B2 | * | 2/2006 | Poveda ......................... | 257/656 |
| 7,227,222 | B2 | * | 6/2007 | Kanematsu .................... | 257/328 |
| 7,259,643 | B2 |   | 8/2007 | Son et al.         |         |
| 2001/0020704 | A1 | * | 9/2001 | Kasahara et al. ............. | 257/106 |
| 2005/0212048 | A1 | * | 9/2005 | Litwin ......................... | 257/350 |
| 2006/0043530 | A1 |   | 3/2006 | Ho et al.          |         |
| 2006/0060941 | A1 |   | 3/2006 | Sun et al.         |         |
| 2008/0029886 | A1 | * | 2/2008 | Cotte et al. ..................... | 257/728 |
| 2008/0191260 | A1 | * | 8/2008 | De Vreede et al. ........... | 257/312 |

FOREIGN PATENT DOCUMENTS

| EP | 0159273 A2 | 10/1985 |
| EP | 1553658 A1 | 7/2005 |
| EP | 1753082 A1 | 2/2007 |
| GB | 2000908 A | 1/1979 |
| JP | 11195959 A | 7/1999 |
| JP | 2000295030 A | 10/2000 |
| KR | 1020050083251 A | 8/2005 |
| WO | 2004/095633 A1 | 11/2004 |
| WO | 2005/109636 A1 | 11/2005 |
| WO | 2005/112194 A1 | 11/2005 |

\* cited by examiner

*Primary Examiner* — Thanh V Pham
*Assistant Examiner* — Andres Munoz
(74) *Attorney, Agent, or Firm* — Sughrue Mion, PLLC (57) ABSTRACT

A semiconductor element for macro and micro frequency tuning, and an antenna and a frequency tuning circuit having the semiconductor element, are provided. The semiconductor element includes first and second semiconductors which have a same polarity, a third semiconductor which has a polarity opposite to the polarity of the first and second semiconductors and is interposed between the first and the second semiconductors, a first intrinsic semiconductor which is interposed between the first and the third semiconductors, and a second intrinsic semiconductor which is interposed between the third and the second semiconductors.

8 Claims, 8 Drawing Sheets

SEMICONDUCTOR FOR MACRO AND MICRO FREQUENCY TUNING, AND ANTENNA AND FREQUENCY TUNING CIRCUIT HAVING THE SEMICONDUCTOR

CROSS-REFERENCE TO RELATED APPLICATIONS

This application claims priority from Korean Patent Application No. 10-2006-0104381, filed on Oct. 26, 2006 in the Korean Intellectual Property Office, the entire disclosure of which is incorporated herein by reference.

BACKGROUND OF THE INVENTION

1. Field of the Invention

Apparatuses consistent with the present invention generally relate to a semiconductor for macro and micro frequency tuning and an antenna and a frequency tuning circuit having the semiconductor. More particularly, the present invention relates to a semiconductor which incorporates a positive, intrinsic, negative (PIN) diode and Varactor diode into one element, and thus is capable of preventing drawbacks such as insertion loss, complexity of a direct current (DC) power supply circuit, size increase, or deterioration of linearity of the Varactor diode, and an antenna and a frequency tuning circuit having the semiconductor.

2. Description of the Related Art

The advancement of wireless communication technology has introduced a variety of wireless communication services for use on devices, such as mobile phones, Personal Digital Assistants (PDA), personal computers, or laptop computers. Such wireless communication services include Global System for Mobile (GSM) communication, Personal Communication Services (PCS), World Interoperability for Microwave Access (WiMAX), Wireless Local Area Network (WLAN), Wireless Broadband Internet (WiBro), and Bluetooth.

The GSM uses a band of 890 KHz~960 MHz. PCS uses a band of 1.8 GHz. WiMAX uses a band of 3.6 GHz~3.8 GHz band. WLAN uses a band of 2.4 GHz under IEEE 802.11b, which is the Industrial, Scientific & Medical band, and uses a band of 5 GHz under IEEE 802.11a, which is the Unlicensed National Information Infrastructure band.

In order to use different wireless communication services being provided at different frequency bands, a wireless terminal is typically equipped with a reconfigurable antenna capable of frequency tuning to a corresponding service band for the transmission and reception of wireless signal and frequency tuning for the channel shift in the service band, a tunable filter, and a matching circuit. The macro tuning generally refers to the frequency tuning from one service band to another, and the micro tuning refers to the frequency tuning in the same service band.

In order to construct a macro-tunable and micro-tunable antenna, filter, and matching circuit, a PIN diode and a Varactor diode can be used.

The resistivity of the PIN diode is dependent on the DC current applied to the diode. Essentially, the PIN diode allows an electric current to flow when the voltage applied to the PIN diode is over threshold voltage, and blocks the electric current when 0 V is applied to the PIN diode. While the PIN diode is connected to a radiator, a filter line, and a matching circuit of the antenna, the length of the radiator, filter line, and matching circuit can be shortened by turning off the PIN diode because it subsequently causes some parts of the radiator, filter line, and matching circuit to be shorted. Therefore, macro tuning is possible by the length adjustment of the antenna, filter, and matching circuit.

When the Varactor diode is employed, inter-channel change in the service band is possible by minutely shifting the frequency and according to the amount of backward voltage being fed.

However, insertion loss occurs if both the PIN diode and the Varactor diode are employed for the macro and the micro tuning, due to respective packaging of the elements. Furthermore, the Varactor diode, as it uses a depletion region rather than an I-region, does not provide good linearity. Furthermore, because inductors for RF block are required to be installed in each of the PIN diode and the Varactor diode to prevent the ingress of RF signal of the DC power supply circuit into the diodes, the DC power supply circuit has a complicated structure and increased size.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a semiconductor which incorporates a positive, intrinsic, negative (PIN) diode and Varactor diode into one element, and thus is capable of preventing drawbacks such as insertion loss, complexity of DC power supply circuit, size increase, or deterioration of linearity of Varactor diode, and an antenna and a frequency tuning circuit having the semiconductor.

According to an aspect of the present invention, there is provided a semiconductor element for macro and micro frequency tuning, which includes first and second semiconductors of same polarity, a third semiconductor of opposite polarity interposed between the first and the second semiconductors, a first intrinsic semiconductor which is interposed between the first and third semiconductors, and a second intrinsic semiconductor which is interposed between the third and second semiconductors.

The first and the second semiconductors may include a p-type semiconductor. The third semiconductor may include an n-type semiconductor.

The first and the second semiconductors may include an n-type semiconductor. The third semiconductor may include a p-type semiconductor.

The first and second intrinsic semiconductors may include a first intrinsic (I) region interposed between the first and the third semiconductors and a second intrinsic (I) region interposed between the third and the second semiconductors.

The first I region may be formed narrower than the second I region.

The first semiconductor, the first I region, and the third semiconductor may operate as a Varactor diode.

The third semiconductor, the second I region, and the second semiconductor may operate as a positive intrinsic negative (PIN) diode.

The semiconductor element may include a first terminal connected with the first semiconductor, a second terminal connected with the second semiconductor, and a third terminal connected with the third semiconductor.

The first and the third terminals may be connected with each other, and a first power source may be arranged on a power line connecting the first and the third terminals.

The second and the third terminals may be connected with each other, and a second power source may be arranged on a power line connecting the second and the third terminals.

The first and the second power sources may be connected such that opposite polarities are connected with the first and the third terminals.

At least one of the first, the second, and the third terminals may include an inductor.

The third terminal may be connected with a ground.

According to another aspect of the present invention, there is provided an antenna for macro and micro frequency tuning, which includes a radiator which radiates electromagnetic wave and a semiconductor element disposed on a predetermined region of the radiator. The semiconductor element includes first and second semiconductors of same polarity, a third semiconductor of opposite polarity interposed between the first and the second semiconductors, a first intrinsic semiconductor which is interposed between the first and third semiconductors, and a second intrinsic semiconductor which is interposed between the third and second semiconductors.

According to another aspect of the present invention, there is provided a frequency tuning circuit including a semiconductor element for macro and micro frequency tuning mounted thereon, wherein the semiconductor element is disposed on a predetermined region of the radiator and includes first and second semiconductors of same polarity, a third semiconductor of opposite polarity interposed between the first and the second semiconductors, a first intrinsic semiconductor which is interposed between the first and third semiconductors, and a second intrinsic semiconductor which is interposed between the third and second semiconductors.

According to another aspect of the present invention, there is provided a filter including a semiconductor element for macro and micro frequency tuning mounted thereon, wherein the semiconductor element is disposed on a predetermined region of the radiator and includes first and second semiconductors of same polarity, a third semiconductor of opposite polarity interposed between the first and the second semiconductors, a first intrinsic semiconductor which is interposed between the first and third semiconductors, and a second intrinsic semiconductor which is interposed between the third and second semiconductors.

According to another aspect of the present invention, there is provided a matching circuit including a semiconductor element for macro and micro frequency tuning mounted thereon, wherein the semiconductor element is disposed on a predetermined region of the radiator and includes first and second semiconductors of same polarity, a third semiconductor of opposite polarity interposed between the first and the second semiconductors, a first intrinsic semiconductor which is interposed between the first and the third semiconductors, and a second intrinsic semiconductor which is interposed between the third and the second semiconductors.

BRIEF DESCRIPTION OF THE DRAWING FIGURES

These and other aspects of the present invention will become more apparent and more readily appreciated from the following description of exemplary embodiments thereof, with reference to the accompanying drawings, in which.

DETAILED DESCRIPTION OF EXEMPLARY EMBODIMENTS OF THE PRESENT INVENTION

Certain exemplary embodiments of the present invention will now be described in greater detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail to avoid obscuring the invention with unnecessary detail for those of ordinary skill in the art.

Figure 1A:
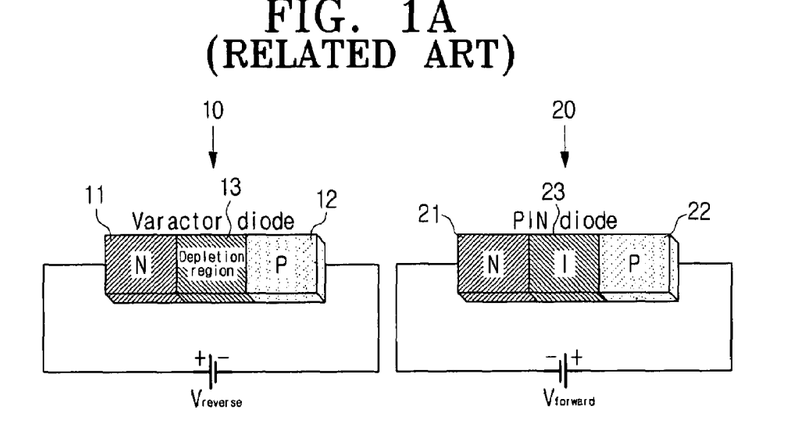
FIG. 1A illustrates the structure of a Varactor diode and a positive intrinsic negative (PIN) diode.
Figure 1B:
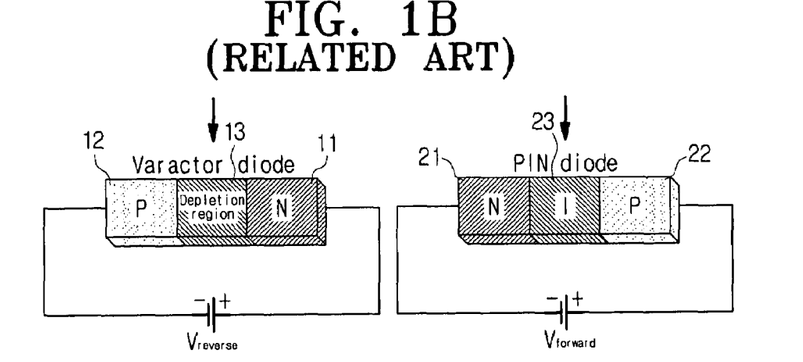
FIG. 1B illustrates the structure of an inversed Varactor diode so that the Varactor diode can be coupled to the PIN diode.
Figure 1C:
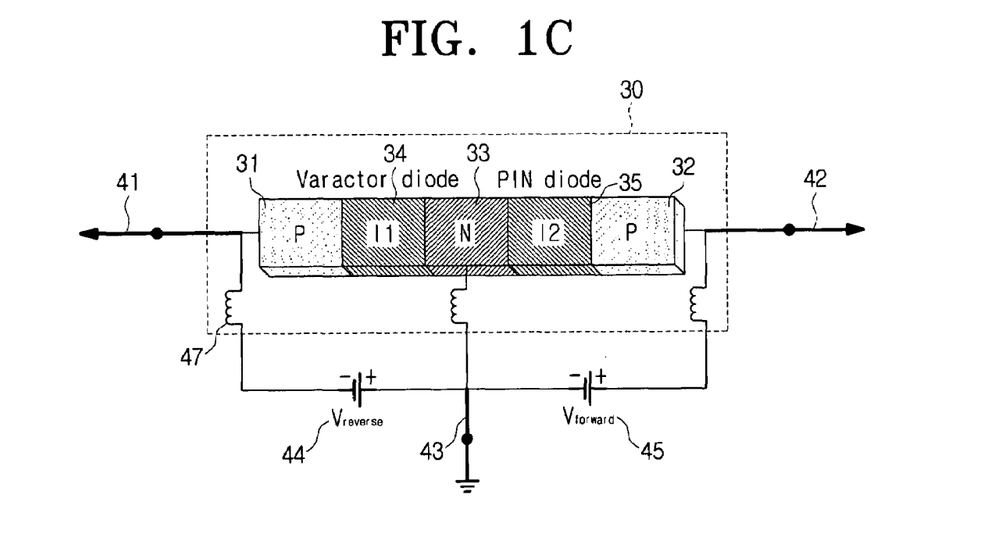
FIG. 1C illustrates the structure of a semiconductor for macro and micro frequency tuning according to an exemplary embodiment of the present invention.

FIGS. 1A to 1C illustrate the process of integrating a Varactor diode and a PIN diode into an integrated element. More specifically, FIG. 1A illustrates the structure of a Varactor diode and a positive intrinsic negative (PIN) diode, FIG. 1B illustrates the structure of inversed Varactor diode so that the Varactor diode can be coupled to the PIN diode, and FIG. 1C illustrates the structure of a semiconductor for macro and micro frequency tuning according to an exemplary embodiment of the present invention.

The Varactor diode 10 includes an n-type semiconductor 11, a depletion region 13, and a p-type semiconductor 12. Each of the n-type and p-type semiconductors 11, 12 is provided with an element. Each element is connected with a DC power source. The positive (+) pole of the DC power source is connected with the n-type semiconductor 11, and the negative (−) pole is connected with the p-type semiconductor 12. As a result, inverse voltage is supplied to the Varactor diode 10.

The PIN diode 20 includes an n-type semiconductor 21, an intrinsic region 23, and a p-type semiconductor 22. Each of the n-type and p-type semiconductors 21, 22 is provided with an element. Each element is connected with a DC power source. The negative (−) pole of the DC power source is connected with the n-type semiconductor 21, and the positive (+) pole is connected with the p-type semiconductor 22.

The Varactor diode 10 is inversed to integrate the Varactor diode 10 and the PIN diode 20 into one element. FIG. 1B shows the inversed Varactor diode 10, in which the p-type semiconductor 12, the depletion region 13, and the n-type semiconductor 11 are arranged in turn. By inversing the Varactor diode 10, the n-type semiconductor 11 of the Varactor diode 10 is positioned adjacent to the n-type semiconductor 21, allowing the Varactor diode 10 and the PIN diode 20 to be integrated into one element by sharing the n-type semiconductor 11, 21.

A semiconductor element 30 for macro and micro frequency tuning according to an exemplary embodiment of the present invention is formed by the combination of the Varactor diode 10 and the PIN diode 20 sharing the n-type semiconductor 11, 21, as shown in FIG. 1C.

Figure 2:
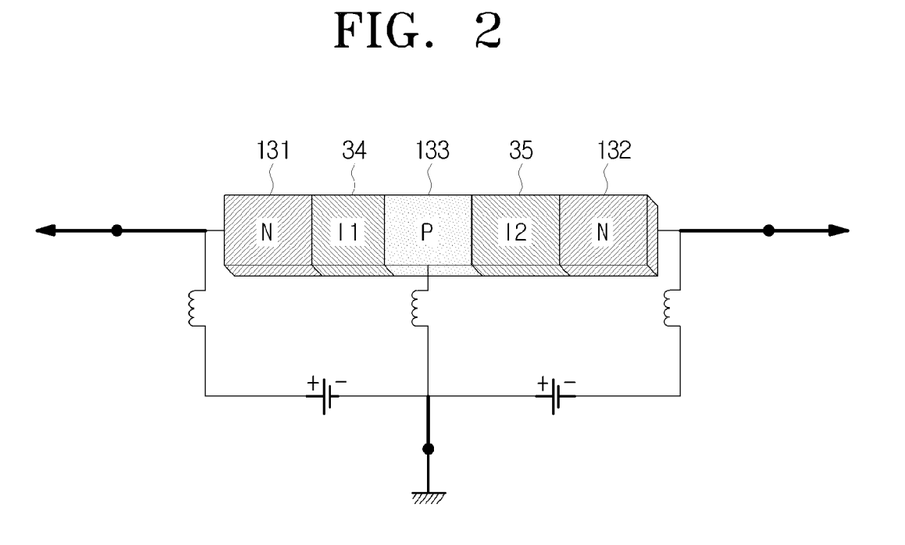
FIG. 2 illustrates the structure of a semiconductor for macro and micro frequency tuning and having an opposite polarity to the semiconductor of FIG. 1C.

In the semiconductor element 30 for macro and micro frequency tuning, first and second semiconductors 31, 32 of the same polarity are arranged on both ends and a third semiconductor 33 of opposite polarity is interposed between the first and second semiconductors 31, 32. In the exemplary embodiment shown in FIG. 1C, the first and second semiconductors 31, 32 are p-type semiconductors and the third semiconductor 33 is an n-type semiconductor. Alternatively, in the exemplary embodiment shown in FIG. 2, first and second semiconductors 131, 132 are n-type semiconductors and a third semiconductor 133 is a p-type semiconductor. An intrinsic semiconductor may be interposed between the first and the third semiconductors 31, 33, and another intrinsic semiconductor may be interposed between the third and the second semiconductors 33, 32. The intrinsic semiconductor between the first and the third semiconductors 31, 33 is called a first I-region 34, and the intrinsic semiconductor between the third and the second semiconductors 33, 32 is called a second I-region 35.

Continuing with FIG. 1C, the semiconductor element 30 may include a first terminal 41 connected with the first semiconductor 31, a second terminal 42 connected with the second semiconductor 32, and a third terminal 43 connected with the third semiconductor 33. The first and the third terminals 41, 43 may be connected with each other, and the second and the third terminals 42, 43 may be connected with each other.

In the semiconductor element 30 explained above, the first semiconductor 31, the first I-region 34, and the third semiconductor 33 operate as Varactor diode parts, and the third semiconductor 33, the second I-region 35, and the second semiconductor 32 operate as PIN diode parts. While the related art Varactor diode parts use depletion regions, the semiconductor element 30 according to an exemplary embodiment of the present invention uses an I-region instead of a depletion region.

Figure 3A:
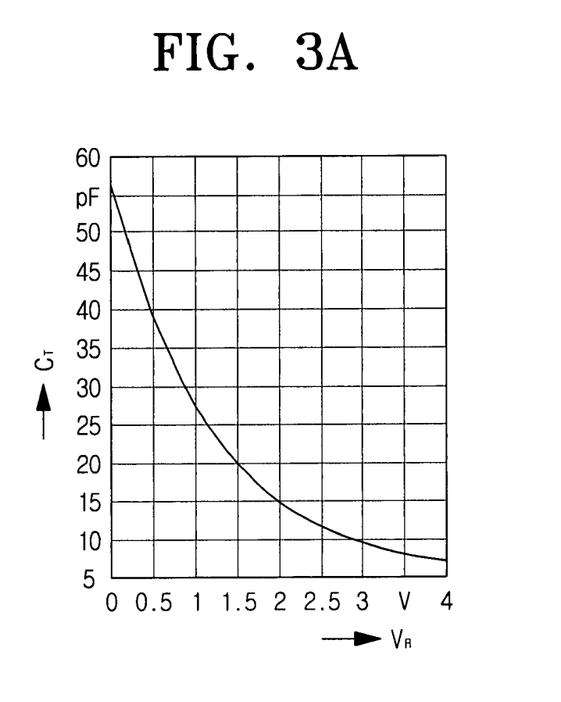
FIG. 3A is a graphical representation of the relation between voltage and capacitance of a related art Varactor diode.
Figure 3B:
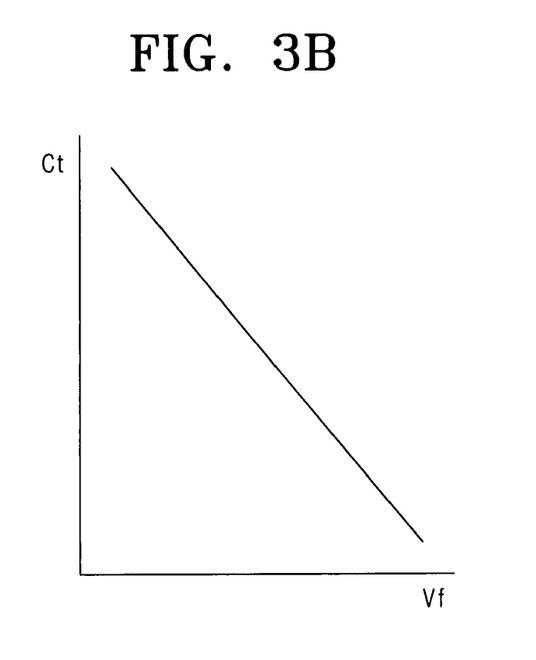
FIG. 3B is a graphical representation of the relation between voltage and capacitance of a Varactor diode according to an exemplary embodiment of the present invention.

A drawback of the related art is illustrated in FIG. 3A, in which the linearity deteriorates by the two-dimensional function variation of capacitance according to voltage. As shown in FIG. 3B, the Varactor diode parts 31, 34, 33 of the semiconductor element 30 according to an exemplary embodiment of the present invention maintains linearity of capacitance with respect to voltage because the diode parts 31, 34, 33 use the intrinsic semiconductor as in the PIN diode. As the linearity increases, the range of variation of capacitance with respect to RF power can be increased.

Because the range of frequency band adjustment of the Varactor diode parts 31, 34, 33 is narrower than that of the PIN diode parts 32, 35, 33, the first I-region 34 is formed narrower than the second I-region 35.

A power line, which connects the first and the third terminals 41, 43 being connected with the Varactor diode parts 31, 34, 33, includes a first power source 44 to supply inverse voltage to the Varactor diode parts 31, 34, 33. The first semiconductor 31, which is a p-type semiconductor, is connected with the negative (−) pole of the first power source 44, and the third semiconductor 33, which is an n-type semiconductor, is connected with the positive (+) pole of the first power source 44.

A power line, which connects the third and the second terminals 43, 42 connected with the PIN diode parts 32, 35, 33, includes a second power source 45 to supply power to the PIN diode parts 32, 35, 33. The third semiconductor 33, i.e., the n-type semiconductor, is connected with the negative (−) pole of the second power source 45, and the second semiconductor 32, i.e., the p-type semiconductor, is connected with the positive (+) pole of the second power source 45.

The first and the second terminals 41, 42 of the semiconductor element 30 may be connected with an element or a circuit available to macro tune and micro tune, respectively, while the third terminal 43 is connected with the ground. Inductors 47 may be formed at the first, second, and third terminals 41, 42, 43 to block ingress of RF signal. The inductors 47 may be formed integrally with the semiconductor element 30.

Figure 4:
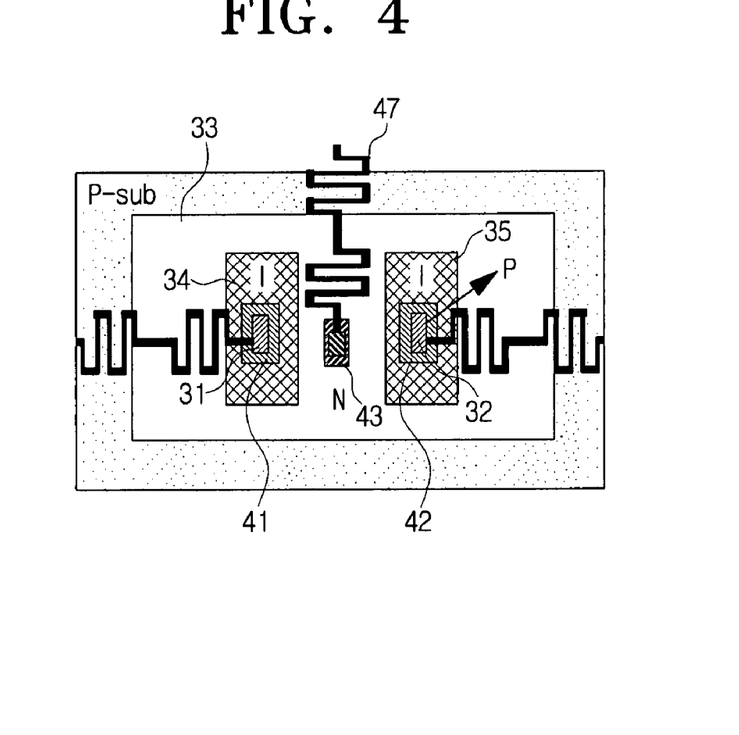
FIG. 4 is a plan view of a semiconductor fabricated based on CMOS compatible processing according to an exemplary embodiment of the present invention.

FIG. 4 is a plan view of a semiconductor fabricated based on CMOS compatible processing according to an exemplary embodiment of the present invention.

Referring to FIG. 4, an n-type semiconductor 33 is arranged on a p-type rectangular substrate, and first and second I-regions 34, 35 are arranged side by side on the n-type semiconductor 33. P-type semiconductors 31, 32 are arranged in the centers of the first and second I-regions 34, 35, respectively. A third terminal 43 is formed in the center of the n-type semiconductor 33, and first and the second terminals 41, 42 are formed along the boundary of the p-type semiconductors 31, 32, respectively. The first to the third terminals 41, 42, 43 are connected with the inductors 47, respectively. Inductors 47 are formed integrally with the semiconductor element 30.

Figure 5:
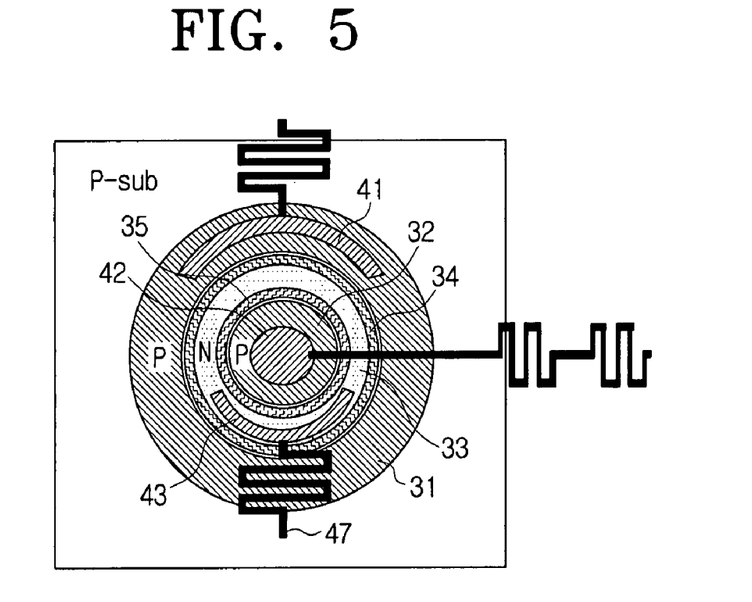
FIG. 5 is a plan view of a semiconductor fabricated based on MESA structure according to an exemplary embodiment of the present invention.

FIG. 5 is a plan view of a semiconductor fabricated based on MESA structure, according to an exemplary embodiment of the present invention.

The semiconductor element 30 of MESA structure includes a p-type semiconductor 31, an n-type semiconductor 33 and a p-type semiconductor 31 arranged in sequence on a p-type substrate. A first I-region 34 and second I-region 35 are formed between the n-type semiconductor 33 and the p-type semiconductors 31, 32, respectively. First to third terminals 41, 42, 43 are formed on the p-type semiconductors 31, 32 and the n-type semiconductor 33, respectively, and inductors 47 are integrally formed on the first to third terminals 41, 42, 43.

Figure 6A:
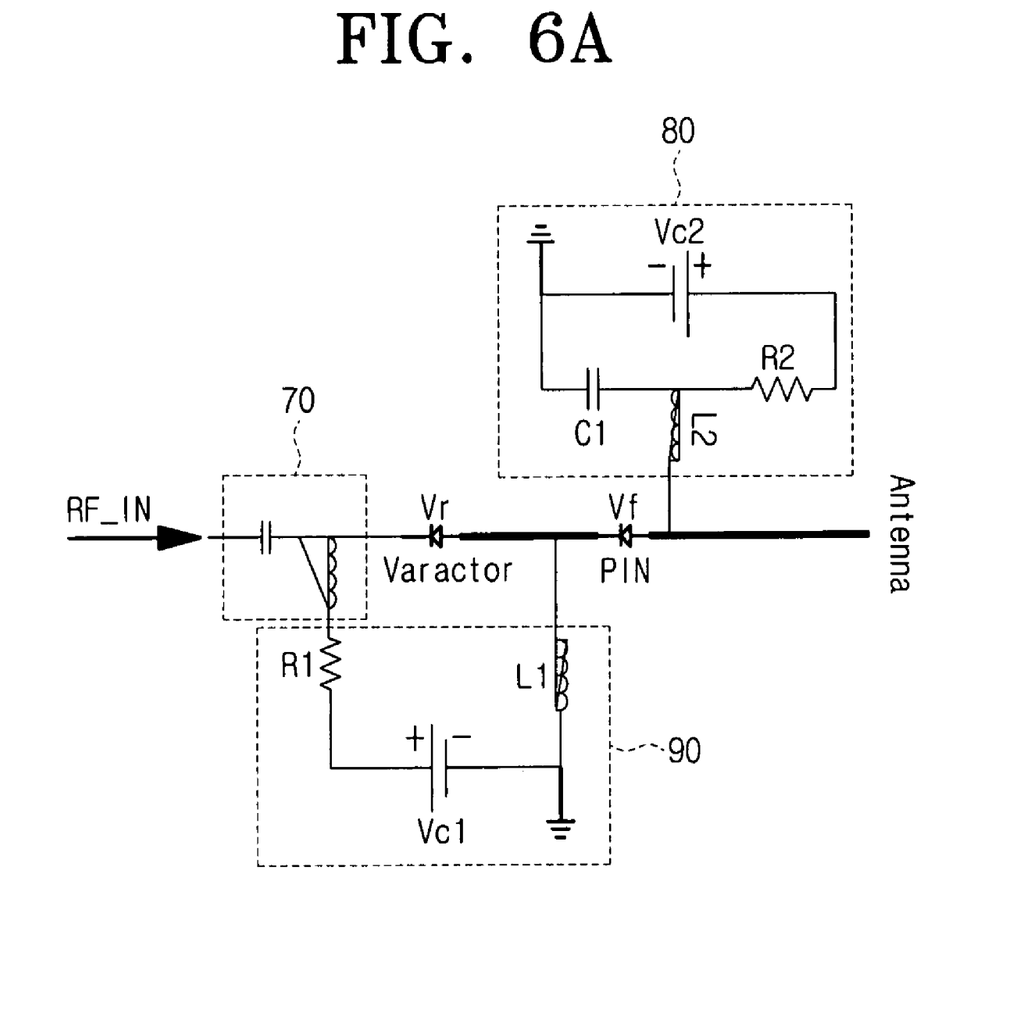
FIG. 6A is a circuit diagram of a DC power supply circuit having a Varactor diode and a PIN diode according to an exemplary embodiment of the present invention.
Figure 6B:
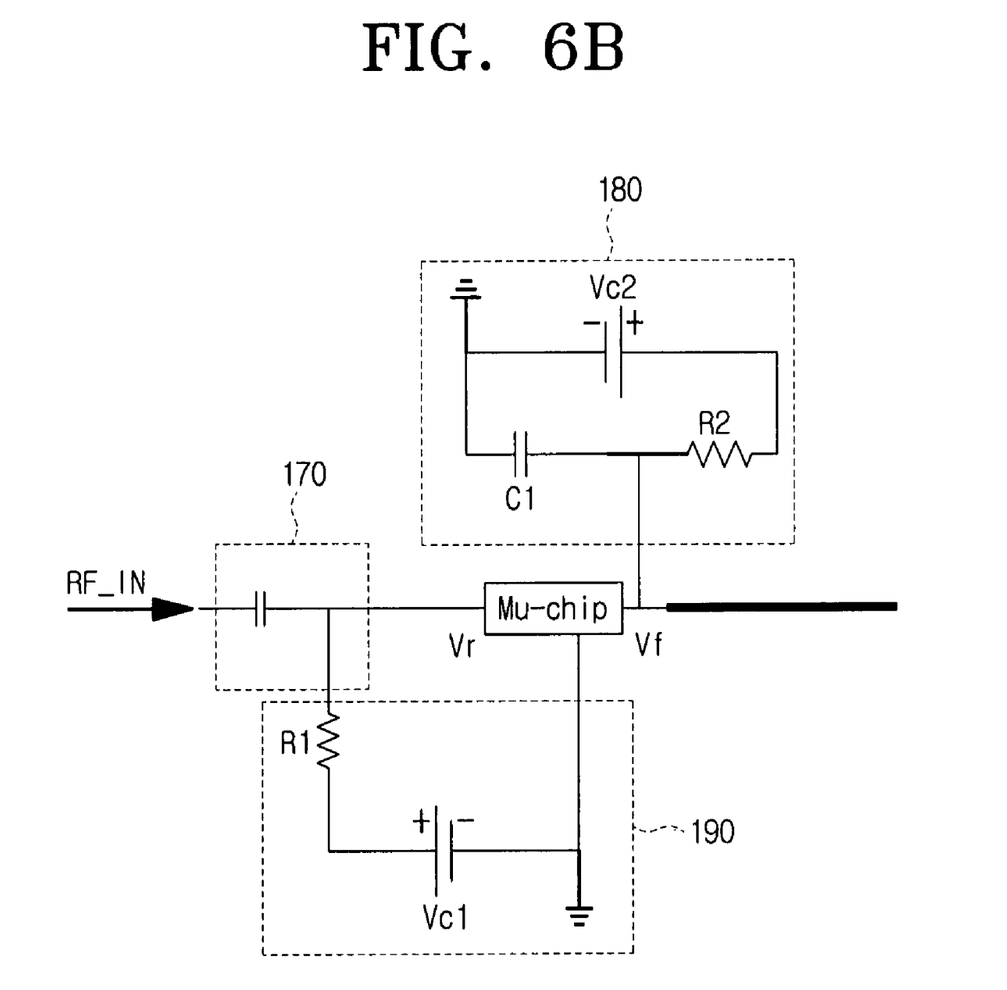
FIG. 6B is a circuit diagram of a DC power supply circuit of a semiconductor according to an exemplary embodiment of the present invention.

FIG. 6A is a circuit diagram of a DC power supply circuit including a Varactor diode and a PIN diode, according to an exemplary embodiment of the present invention, and FIG. 6B is a circuit diagram of a DC power supply circuit of a semiconductor according to an exemplary embodiment of the present invention.

Referring to FIG. 6A, in the related, the inductors 47 were mounted to the DC block circuit 70, the PIN diode DC bias circuit 80, and the Varactor diode DC bias circuit 90 to block ingress of RF signal. As a plurality of inductors 47 are mounted, the DC power supply circuit becomes complicated, and the size of the circuit also increases.

The semiconductor element 30 according to an exemplary embodiment of the present invention has the inductor 47 integrally formed therein, which omits the need for separate inductors for the DC block circuit 170, PIN diode DC bias circuit 180, and Varactor diode DC bias circuit 190 (see FIGS. 4 and 5). As the inductors 47 are removed from the DC power supply circuit, as shown in FIG. 6B, the DC power supply circuit becomes simpler and compact-sized.

Figure 7:
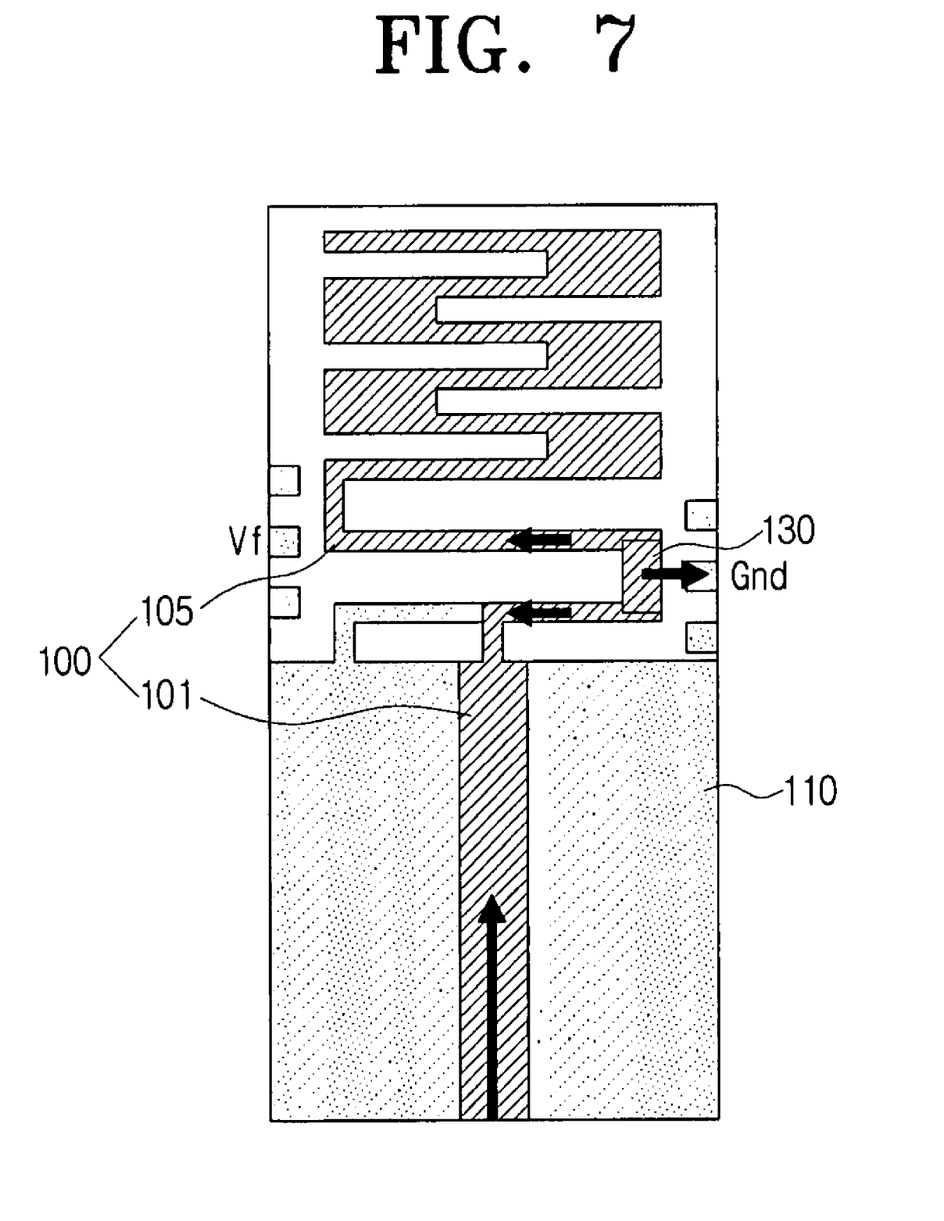
FIG. 7 illustrates an antenna provided with a semiconductor according to an exemplary embodiment of the present invention.

FIG. 7 illustrates an antenna provided with a semiconductor according to an exemplary embodiment of the present invention.

The antenna in FIG. 7 includes a radiator 100, a ground 110, and a semiconductor element 130 for macro and micro frequency tuning. The semiconductor element may be, for example, the semiconductor element shown in FIG. 1C or 2.

The ground 10 is attached to a side of circuit board, and electrically connected with the radiator 100.

The radiator 100 is configured in a patch antenna form and attached to the other side of the circuit board. The radiator 100 includes a meander line part 105 which is bent in a lengthwise direction a plurality of times and a strip type feeding part 101.

The meander line part 105 is extended from an end of the feeding part 101 and bent in a zigzag pattern. The end of the meander line part 105 facing the feeding part 101 is electrically connected with the ground 10 through a via hole.

The semiconductor element 130 for macro and micro frequency tuning may be mounted to one end of the meander line part 105 and operated to electrically close or open the meander line connected with both ends of the semiconductor element 130.

The PIN diode parts 32, 35, 33 of the semiconductor element 130 have 1Ω of serial resistance component and are turned on, according to a predetermined voltage. As a result, the meander line connected by the semiconductor element 130 is shorted, and the length of the radiator 100 becomes the total length of the feeding part 101 and the meander line part 105.

If the voltage is not supplied, the PIN diode parts 32, 35, 33 have 10 kΩ of serial resistance component, and are turned off. As a result, the meander line being connected by the semiconductor element 130 is open, and the total length of the radiator 100 corresponds to the length of the feeding part 101 being added with the length of the meander line part 105 up to the semiconductor element 130. Accordingly, the radiator 100 has a shorter length and a higher resonance frequency than when the PIN diode parts 32, 35, 33 are turned on.

The Varactor diode parts 31, 34, 33 of the semiconductor element 130 have capacitance varying according to the size of inverse voltage being supplied thereto, and cause the frequency of the antenna to vary within the service band.

That is, the Varactor diode parts 31, 34, 33 receive inverse voltage that continuously varies from about 0V to about 3V according to the first power source 44. Before the inverse voltage bias is supplied, the first I-region 34 of the Varactor diode occupies the narrowest area and thus has the highest capacitance. The point of resonance of the antenna is formed at a channel having the lowest frequency within the service band.

As the inverse voltage is supplied to the Varactor diode parts 31, 34, 33, the depletion region increases and the capacitance decreases. The point of resonance of the antenna moves to a channel of higher frequency within the service band. In other words, as the inverse voltage provided to the Varactor diode parts 31, 34, 33 increases, the point of resonance is moved to the higher frequency channel. As a result, channel shift within the service band, i.e., the micro tuning, is performed by adjusting the inverse voltage being provided to the Varactor diode parts 31, 34, 33.

In one exemplary embodiment, the length of the radiator 100 increases when the PIN diode parts 32, 35, 33 are turned on such that a point of resonance is formed around 2.4 GHz, and the length of the radiator 100 decreases when the PIN diode parts 32, 35, 33 are turned off such that a point of resonance is formed around 5.3 GHz. These are listed in the following table.

TABLE 1

| Frequency | 1st terminal voltage | 3rd terminal voltage | 2nd terminal voltage |
|---|---|---|---|
| 2.4 GHz | 1 V | 0 V | 1 V |
| 2.48 GHz | 3 V | 0 V | 1 V |
| 5.15 GHz | 1 V | 0 V | 0 V |
| 5.35 GHz | 3 V | 0 V | 0 V |

The second terminal 42 includes the PIN diode parts 32, 35, 33. If 1 V is supplied to the second terminal 42, the PIN diode parts 32, 35, 33 are turned on, and the point of resonance of the antenna ranges from about 2.4 GHz to about 2.48 GHz. If 0 V is supplied to the second terminal 42, the PIN diode parts 32, 35, 33 are turned off, and the point of resonance of the antenna ranges from about 5.15 GHz to about 5.35 GHz. That is, macro tuning is performed as the PIN diode parts 32, 35, 33 are turned on or off.

The first terminal 41 include the Varactor diode parts 31, 34, 33. While the PIN diode parts 32, 35, 33 are on, the antenna resonates at 2.4 GHz by supplying 1 V of inverse voltage to the first terminal 41, and resonates at 2.48 GHz by supplying 3 V of inverse voltage to the first terminal 41. Frequency in the range of 2.4 GHz to 2.48 GHz is linearly adjustable according to the linear varying of the capacitance by supplying inverse voltage from about 1V to about 3V to the first terminal 41.

While the PIN diode parts 32, 35, 33 are off, the antenna varies from about 5.15 GHz to about 5.35 GHz by supplying inverse voltage from about 1V to about 3V to the Varactor diode parts 31, 34, 33. That is, micro tuning is performed by adjusting the inverse voltage being provided to the PIN diode parts 32, 35, 33.

Because the length of the radiator 100 is variable according to the turning on or off of the PIN diode, the length of the radiator 100 can be varied by appropriately changing the design. Accordingly, designs for wireless communication services such as GSM, PCS, WiMAX, WLAN, WiBro, Bluetooth, are enabled.

Figure 8:
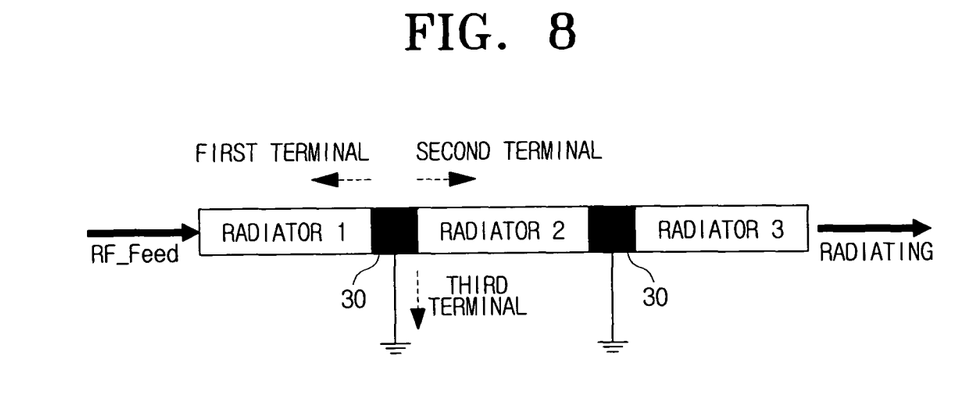
FIG. 8 schematically illustrates the structure of an antenna provided with a plurality of semiconductors according to an exemplary embodiment of the present invention.

FIG. 8 schematically illustrates the structure of an antenna provided with a plurality of semiconductors according to an exemplary embodiment of the present invention.

The antenna according to an exemplary embodiment includes a plurality of radiators and the semiconductor element 30 interposed between the respective radiators. When connected with the radiators, the first and the second terminals 41, 42 of the semiconductor element 30 are connected with the radiators positioned before and after, and the third terminal 43 is connected with the ground.

By mounting a plurality of semiconductor elements 30 between a plurality of radiators, multi-stage adjustment of frequency band is enabled according to whether the PIN diode parts 32, 35, 33 are turned on or off. As a result, a plurality of wireless communication services of different frequency bands can be provided. Channel shifting is also enabled in the respective service frequency bands by adjusting the inverse voltage being provided to the Varactor diode parts 31, 34, 33.

Figure 9:
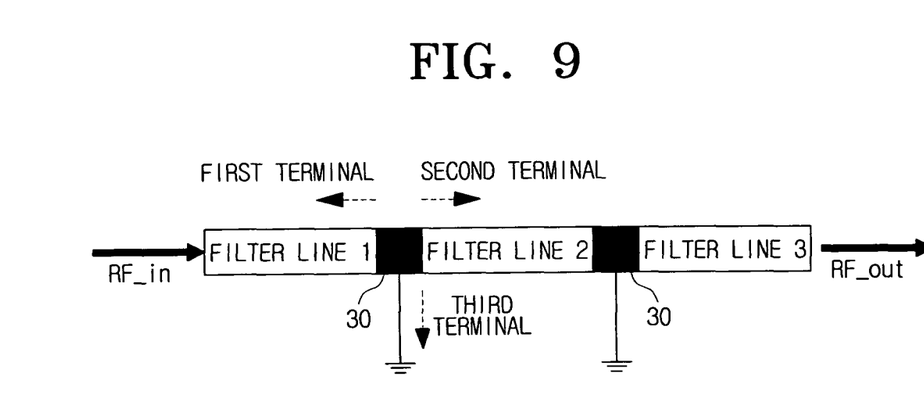
FIG. 9 schematically illustrates a filter provided with a plurality of semiconductors according to an exemplary embodiment of the present invention.

FIG. 9 schematically illustrates a filter provided with a plurality of semiconductors according to an exemplary embodiment of the present invention.

The semiconductor element 30 according to an exemplary embodiment of the present invention may implement a variety of elements and circuit for the frequency tuning, such as a tunable filter and a matching circuit. FIG. 9 particularly illustrates the semiconductor element 30 mounted to the filter.

A filter generally includes an inductor or a capacitor, but FIG. 9 simply illustrates one filter in a line. The semiconductor elements 30 are mounted between a plurality of filter lines operating as the filters. The first and the second terminals 41, 42 of the semiconductor element 30 are connected with the filter lines, and the third terminal 43 is connected with the ground. Because a plurality of semiconductor elements 30 is mounted to the filters, macro tuning to the filtered frequency band is enabled by use of the PIN diode parts 32, 35, 33, and micro tuning to the filtered frequency band is also enabled by use of the Varactor diode parts 31, 34, 33.

As explained above, according to the exemplary embodiments of the present invention, the semiconductor element 30 for macro and micro tuning includes an element integrating therein the PIN diode and the Varactor diode, and the inductor integrally formed therewith. Accordingly, insertion loss due to the use of a plurality of elements can be reduced, and, because the inductor is removed from the DC power supply circuit, the DC power supply circuit can be simplified and reduced in size. Additionally, by changing the depletion region of the Varactor diode parts to I-region, the linearity of the Varactor diode parts is improved. Furthermore, by use of one integrated element, price decreases and circuit integrity increases.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A semiconductor element comprising:
   first and second semiconductors which have a same polarity;
   a third semiconductor which has a polarity opposite to the polarity of the first and second semiconductors, and is interposed between the first and second semiconductors in a width direction;
   a first intrinsic semiconductor which is interposed between the first and third semiconductors;
   a second intrinsic semiconductor which is interposed between the third and second semiconductors;
   a first terminal connected with the first semiconductor;
   a second terminal connected with the second semiconductor; and
   a third terminal connected with the third semiconductor,
   wherein at least one of the first, the second, and the third terminals comprises an inductor,
   the inductor is integrally formed with the at least one of the first, the second, and the third semiconductors to which the inductor is connected,
   the first intrinsic semiconductor comprises a first intrinsic region and the second intrinsic semiconductor comprises a second intrinsic region,
   the first intrinsic region is narrower than the second intrinsic region in the width direction,
   the first and third terminals are connected with each other, and a first power source is arranged on a power line connecting the first and third terminals,
   the second and third terminals are connected with each other, and a second power source is arranged on a power line connecting the second and third terminals, and
   the first and second power sources are connected such that opposite polarities are connected with the first and the third terminals.

2. The semiconductor element of claim 1, wherein each of the first and second semiconductors comprises a p-type semiconductor, and the third semiconductor comprises an n-type semiconductor.

3. The semiconductor element of claim 1, wherein each of the first and second semiconductors comprises an n-type semiconductor, and the third semiconductor comprises a p-type semiconductor.

4. The semiconductor element of claim 1, wherein the first semiconductor, the first intrinsic region, and the third semiconductor form a Varactor diode.

5. The semiconductor element of claim 1, wherein the third semiconductor, the second intrinsic region, and the second semiconductor form a positive intrinsic negative diode.

6. The semiconductor element of claim 1, wherein the third terminal is connected with ground.

7. The semiconductor element of claim 1, wherein a cross-sectional width of the first intrinsic region is narrower than a cross-sectional width of the second intrinsic region.

8. The semiconductor element of claim 1, wherein a width of the first intrinsic region taken between the first semiconductor and the third semiconductor is narrower than a width of the second intrinsic region taken between the second semiconductor and the third semiconductor.

* * * * *